(12) United States Patent
Roosenboom et al.

(10) Patent No.: US 9,088,065 B2
(45) Date of Patent: Jul. 21, 2015

(54) ANTENNA UNIT WITH AUTOMATIC TUNING

(75) Inventors: Derk Jan Roosenboom, Haaksbergen (NL); Jan Cornelis Stekelenburg, Winterswijk (NL)

(73) Assignee: N.V. NEDERLANDSCHE APPARATENFABRICK NEDAP, Groenlo (NL)

( * ) Notice: Subject to any disclaimer, the term of this patent is extended or adjusted under 35 U.S.C. 154(b) by 1246 days.

(21) Appl. No.: 12/718,698

(22) Filed: Mar. 5, 2010

(65) Prior Publication Data

US 2011/0148583 A1    Jun. 23, 2011

(30) Foreign Application Priority Data

Mar. 6, 2009  (NL) ..................................... 2002596

(51) Int. Cl.
   *H01Q 1/50*    (2006.01)
   *H01Q 7/00*    (2006.01)
   *G06K 7/00*    (2006.01)
   *H01Q 1/22*    (2006.01)
   *H03H 7/40*    (2006.01)

(52) U.S. Cl.
   CPC ................ *H01Q 7/00* (2013.01); *G06K 7/0008* (2013.01); *H01Q 1/2216* (2013.01); *H03H 7/40* (2013.01)

(58) Field of Classification Search
   CPC ............................... H01Q 7/00; H01Q 1/2225
   USPC ............. 340/10.1, 572.7; 343/741, 860, 861, 343/866
   See application file for complete search history.

(56) References Cited

U.S. PATENT DOCUMENTS

| 3,949,388 | A | * | 4/1976 | Fuller ...................... 340/870.17 |
| 5,367,291 | A | * | 11/1994 | Fockens .................... 340/572.5 |
| 5,574,470 | A | * | 11/1996 | de Vall ......................... 343/895 |
| 6,055,420 | A | * | 4/2000 | Veranth ..................... 455/193.1 |
| 6,839,035 | B1 | * | 1/2005 | Addonisio et al. ............ 343/742 |
| 6,940,467 | B2 | * | 9/2005 | Fischer et al. ................ 343/850 |
| 7,102,587 | B2 | * | 9/2006 | Benton et al. ................ 343/873 |
| 7,256,695 | B2 | * | 8/2007 | Hamel et al. ............... 340/572.1 |
| 7,764,236 | B2 | * | 7/2010 | Hill et al. ...................... 343/702 |

(Continued)

FOREIGN PATENT DOCUMENTS

| EP | 0 646 984 A1 | 4/1995 |
| EP | 0987647 A2 | 3/2000 |

(Continued)

OTHER PUBLICATIONS

European Search Report for NL 2002596 dated Jul. 22, 2009.

(Continued)

*Primary Examiner* — Dameon E Levi
*Assistant Examiner* — Hasan Islam
(74) *Attorney, Agent, or Firm* — Leydig, Voit & Mayer, Ltd.

(57) ABSTRACT

An antenna unit provided with an antenna which comprises at least one turn, wherein the antenna unit is further provided with an electronic circuit which is connected with the antenna, wherein the electronic circuit comprises connection contacts for connecting the antenna unit with a transmitting device, wherein the electronic circuit is arranged to draw energy from a transmission signal which is supplied to the connection contacts and, utilizing this energy, to tune the antenna unit such that this antenna unit has an impedance which has at least substantially no imaginary component in use of the transmission signal concerned.

27 Claims, 2 Drawing Sheets

(56) References Cited

U.S. PATENT DOCUMENTS

| | | |
|---|---|---|
| 7,800,503 B2 * | 9/2010 | De Witte et al. ............ 340/572.7 |
| 7,825,802 B2 * | 11/2010 | Baiker et al. ................ 340/572.1 |
| 8,400,269 B2 * | 3/2013 | Tuttle ............................ 340/10.1 |
| 8,660,487 B2 * | 2/2014 | Kargl et al. ................... 455/41.2 |
| 2005/0003771 A1 | 1/2005 | De Ruijter et al. |
| 2007/0091006 A1 | 4/2007 | Thober et al. |
| 2008/0079650 A1 | 4/2008 | Constantinidis et al. |

FOREIGN PATENT DOCUMENTS

| | | |
|---|---|---|
| WO | WO 2005/006579 A1 | 1/2005 |
| WO | WO 2007/115422 A1 | 10/2007 |

OTHER PUBLICATIONS

European Patent Office, Office Action in corresponding European Patent Application No. 10155574.6 dated Dec. 5, 2013.

* cited by examiner

ANTENNA UNIT WITH AUTOMATIC TUNING

The invention relates to an antenna unit provided with an antenna which comprises at least one turn.

The invention also relates to a system provided with such a unit and a reader for reading out a responder, wherein the reader is connected with the connection contacts of the antenna unit for supplying a transmission signal to the antenna unit for emitting an electromagnetic interrogation field with the antenna unit.

Such an antenna unit and system are known per se.

For identification of the responder, use is made of the reader. This reader communicates with the responder via the antenna unit. With a transmitter of the reader and the antenna unit, an electromagnetic interrogation field is emitted. The responder responds when introduced into the interrogation field. Often, the responder will modulate the interrogation field with a code stored in the responder. To this end, the responder draws energy from the interrogation field. The code is often an identification code. The reader thereupon detects the code emitted by the responder, with the aid of a receiver of the reader. In many situations, the antenna unit consists of an antenna with a number of wire turns of a well-conducting material such as copper wire for the high-frequency current of the transmitter of the reader. This coil may be built up from many wire turns, with the generated electromagnetic interrogation field being proportional to the sum of the currents through all separate wire turns.

Sometimes, it is practical to use only one turn. All required current for the electromagnetic field must then flow through this single turn. Often, however, a multiplicity of turns is opted for. It is noted that although the label responds to the electromagnetic interrogation field, this is typically understood to mean the near field, in which, at least principally, the magnetic component plays a role for generating a current through the at least one turn.

Independently of the selected number of turns, the coil which is formed by the turns of the antenna will possess self-induction. In addition, the coil has its own resistance, chiefly as a result of the resistance of the coil metal used. As a result of this resistance, energy is lost which must be supplied continuously by the transmitter of the reader until an equilibrium is achieved.

The self-induction has as a consequence that the impedance of the antenna is relatively high. As a result, a high voltage needs to be provided by the transmitter of the reader to make a sufficiently high current in the antenna possible. This process is extremely inefficient. To optimize efficiency, it is known to tune an antenna. Such tuning may be done in a manner known per se by connecting a capacity in series with the antenna, where the capacity has an impedance that is an inverse of the impedance of the coil formed by the antenna. The imaginary component of the impedance of the coil is then compensated by the imaginary impedance of the capacity. The result is that the assembly of antenna and capacity has only the earlier-mentioned loss resistance as impedance.

Each time an antenna is made, and/or is installed again and/or is connected to a reader and/or when another transmission frequency is chosen, a magnitude of the capacity needs to be chosen that has the opposite value to the imaginary component (=inductance) of the impedance of the coil formed by the antenna. This tuning of the antenna is relatively labor intensive. Further, the value of the imaginary component of the antenna may vary in time, through temperature variations, through variations of the environment or other causes, so that it is difficult to keep the antenna well-tuned at all times, and in some cases re-tuning is desirable.

The invention contemplates providing an antenna unit that makes it possible to resolve a number of these disadvantages.

The antenna unit according to the invention is accordingly characterized in that the antenna unit is further provided with an electronic circuit which is connected with the antenna, wherein the electronic circuit comprises connection contacts for connecting the antenna unit with a transmitting device, wherein the electronic circuit is arranged to draw the energy which the electronic circuit needs for its operation from a transmission signal which is supplied to the connection contacts and, utilizing this energy, to tune the antenna unit such that this antenna unit has an impedance which has at least substantially no imaginary component in use of the transmission signal concerned. As the electronic circuit can independently tune the antenna unit, many advantages can be achieved. The ability to tune independently has as an advantage that no energy source other than the transmitting device is needed for the operation of the electronic circuit. The transmitting device hence provides the energy that the electronic circuit needs for its operation. Thus, the electronic circuit may be arranged, for example, to be activated for carrying out a tuning of the antenna. For example, activation may be done automatically when the antenna unit is installed for the first time, for example when it is connected to a reader and the reader starts supplying the transmission signal to the antenna unit. It is also conceivable, however, that the electronic circuit is so arranged as to automatically tune the antenna unit at predetermined times when the latter is connected to a transmitter which generates a transmission signal. Hence, in that case, variations resulting from temperature influences on the tuning can be compensated at the predetermined times. To this end, the electronic circuit may be provided, for example, with a clock that takes care at regular times that the tuning is carried out. It is also conceivable, however, that the tuning can be carried out in that an activation signal is supplied to the electronic circuit. Such an activation signal may be supplied, for example, to the connection contacts. Thus, it is possible, for example, that a reader connected to the connection contacts generates such an activation signal and supplies it to the antenna unit to cause the electronic circuit of the antenna unit to tune the antenna unit again. It is also conceivable that the tuning is carried out by energization of a button of the electronic circuit.

In particular, it holds that the electronic circuit is mechanically attached to the antenna. Preferably, it holds here that the electronic circuit is included in a housing which is mechanically attached to the antenna. Such a housing may be provided, for example, by injection molding. The antenna unit can then be made of particularly robust design without entailing a risk of the electronic circuit being damaged.

According to a practical embodiment, the antenna unit comprises the connection contacts mentioned to connect the antenna unit to a transmitter and possibly a receiver, so, for example, to a reader which is provided with a transmitter and a receiver. Via the connection contacts the transmission signal of the transmitter is then supplied to the antenna unit and possibly a reception signal received with the antenna unit is supplied to the receiver. Also, for example, via these connection contacts an activation signal is supplied to the electronic circuit for activating the tuning referred to.

In particular, it holds that the electronic circuit is provided with a tuning circuit which forms a tuning capacity which is connected with the antenna, wherein the tuning circuit is arranged to be able to set the magnitude of the tuning capacity. Here, it holds preferably that the electronic circuit is arranged to determine and set a magnitude of the tuning capacity, such that this tuning capacity at least substantially compensates the imaginary part of the impedance of the antenna at the transmission signal. The antenna unit of the invention can be used with advantage in combination with a reader for reading out labels such as identification labels. Such labels, for example, are worn by animals. The antenna unit may here be arranged for operation in a half-duplex system and also for operation in a full-duplex system. Such variants belong to the possibilities of the invention. It is also possible that the antenna unit is used solely as transmitting antenna and so is connected solely with a transmitter.

The system according to the invention has as a feature that the reader is connected with the connection contacts for supplying a transmission signal to the antenna unit for emitting an electromagnetic interrogation field with the antenna, wherein a responder when introduced into the interrogation field responds by emitting a reply signal.

The invention will presently be elucidated in more detail on the basis of the drawings. In the drawings.

Figure 1:
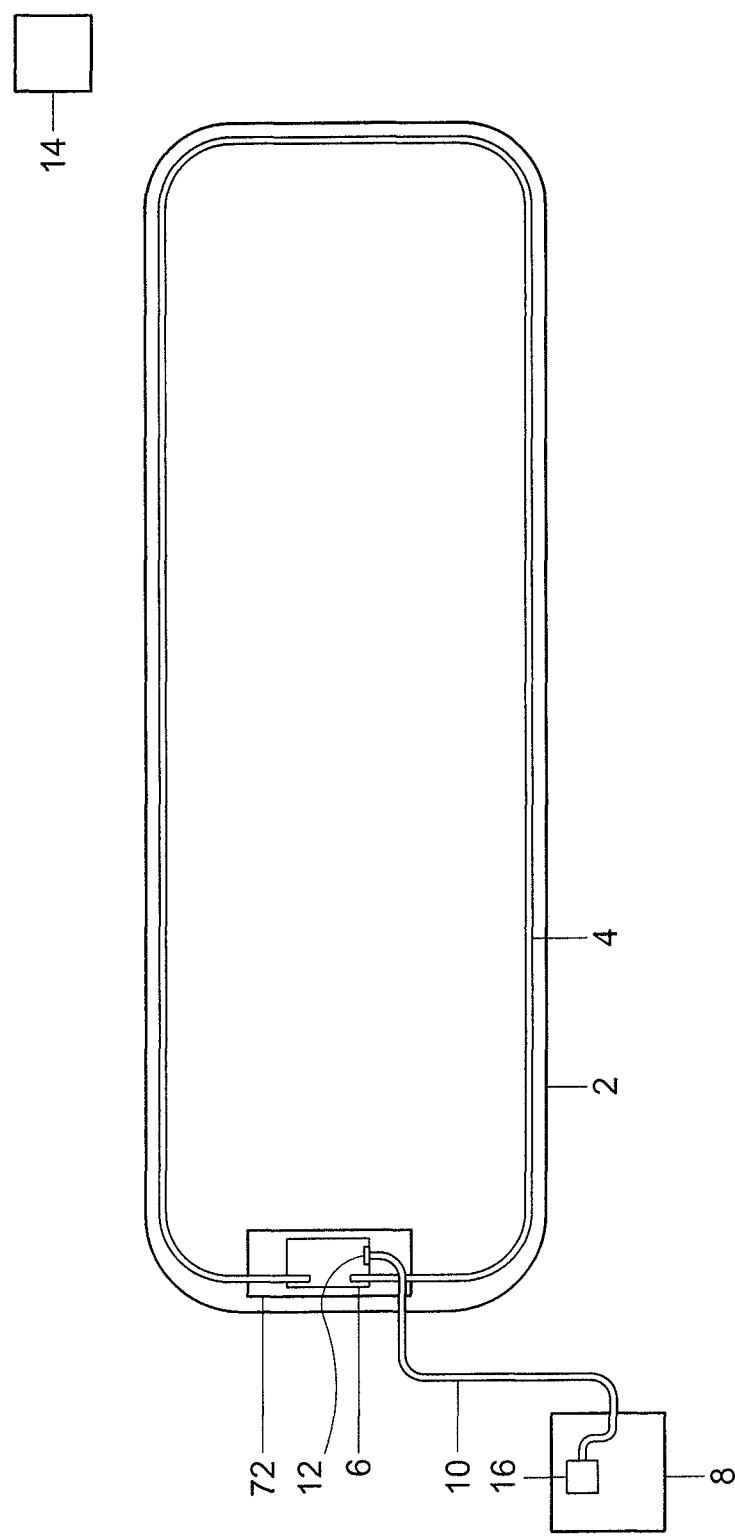
FIG. 1 shows a possible embodiment of a system according to the invention which is provided with an antenna unit according to the invention and a reader connected with the antenna unit.

With reference numeral 1 a possible embodiment of a system according to the invention is designated. The system is provided with an antenna unit 2 which comprises at least one turn 4. In this example, the antenna unit comprises one single turn 4. The antenna unit 2 is further provided with an electronic circuit 6 which is connected with the antenna 4. In the example, the system is further provided with a reader 8, known per se, which is connected via a line 10 with connection contacts 12 of the antenna unit 2. In this example, the system 1 is intended, for example, to read out a transponder 14 wirelessly. To that end, a transponder 14 may be provided with a resonant circuit which responds when introduced into an electromagnetic interrogation field emitted by the system with the aid of an antenna unit. A responder may be provided, for example, with a chip which comprises an identification code, this identification code being emitted by the responder when it responds to the electromagnetic interrogation field. Practically speaking, the responder will be in the near field of the antenna, in which the magnetic field component of the electromagnetic interrogation field is present much more strongly than the electrical field component of the electromagnetic interrogation field. For this reason, sometimes reference is made to a (varying) magnetic field to which the responder responds.

A reply signal emitted by the responder can therefore comprise the identification code. In this example, the reader 8 is provided with a transmitter/receiver 16 which supplies a transmission signal to the antenna unit 2 via the line 10. On the basis of this transmission signal, the antenna unit 2 emits the electromagnetic interrogation field with the antenna 4. The reply signal that is emitted by the responder, in turn, is received by the antenna 4 and supplied via line 10 to the transmitter/receiver 16 of the reader 8 for further processing. The reply signal can be, for example, a signal that modulates the interrogation field with a code that represents the identification code. The system can therefore work as an absorption system. It is also possible, however, that the system works as a so-called transmission system.

Figure 2:
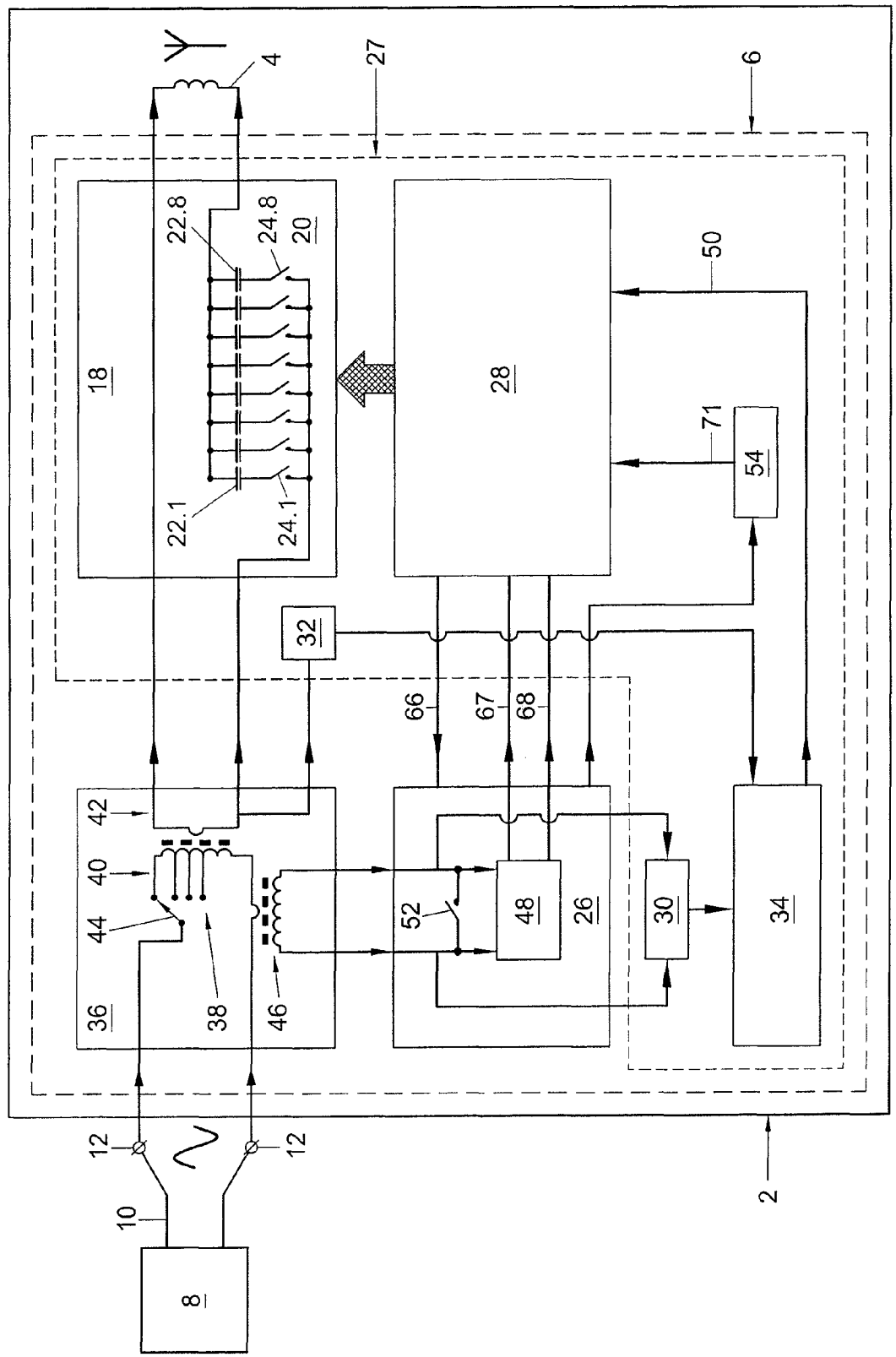
FIG. 2 shows a block diagram of the system according to FIG. 1.

The electronic circuit 6 is connected to the antenna 4 (see FIG. 1 and see FIG. 2), with the electronic circuit comprising the connection contacts 12 for connecting the antenna unit with the reader 8. The electronic circuit is arranged to draw energy from a transmission signal which is supplied to the connection contacts 12 and, using this energy, to tune the antenna 4 such that the antenna unit has an impedance which, at least substantially, has no imaginary component in use of the transmission signal concerned. To this end, in this example (see FIG. 2), the electronic circuit is provided with a tuning circuit 18 which, in use, forms a tuning capacity 20 which is connected (in this example in series) with the antenna 4, the tuning circuit being arranged to be able to set the magnitude of the capacity. In this example, the tuning circuit 18 is provided with a multiplicity of different capacities 22.1-22.8. Each capacity $22.i$ ($i=1, 2, \ldots 8$) can be connected with the antenna 4 through an associated switch $24.i$. The capacities $22.i$ may, for example, set up a binary series. Thus, for example, a capacity $22.i$ may in each case be a half of the capacity $22.i-1$ ($i=2, 3, 4, \ldots 8$). In this way, through selection of a capacity $22.i$ or a combination of capacities $22.i$, effectively a value of the tuning capacity 20 may be chosen which is connected with the antenna 4. The tuning circuit is so arranged that a magnitude of the tuning capacity 20 is selected which, at least substantially, compensates the imaginary component of the antenna 4. The fact is, in this example the antenna 4 consists of a single turn which has a particular impedance $R+j2\pi fL$, where f is the nominal frequency of the transmission signal, R is the resistance of the antenna, and L is the inductance of the antenna. The imaginary component of the impedance of the antenna ($j2\pi fL$) can be compensated by the impedance of the capacity 2, which is equal to $-j/(2\pi fC)$ where C is the magnitude of the capacity of the tuning capacity 20. The electronic circuit is so arranged as to choose a magnitude of the tuning capacity C (20) which compensates, at least substantially, the imaginary part of the impedance of the antenna at the transmission signal concerned, in this example a signal having a nominal frequency f.

The electronic circuit is further provided with a supply circuit 26 for taking up energy from the transmission signal. Furthermore, the electronic circuit is provided with a measuring and control circuit 27 which is connected with the supply circuit 26 for obtaining energy. The measuring and control circuit 27 is provided with a control circuit 28, a current circuit 30 for generating a first signal which represents the phase of the current through the antenna 4, and a voltage circuit 32 for generating a second signal which represents the phase of a voltage across the series connection of antenna 4 and the tuning capacity 20. Furthermore, the measuring and control circuit 27 is provided with a phase comparator 34 for comparing the first signal and the second signal. The electronic circuit is further provided with a transformation selection circuit 36 which is provided with a settable transformer 38 which is connected by a first side 40 with the connection contacts 12 and which is connected by a second side 42 with the tuning circuit 18. The ratio between the number of turns on the first side 40 of the transformer 38 and the number of turns on the second side 42 of the transformer 38 is settable, in this example with the aid of a selection switch 44. The selection switch 44 may be operated, for example, by hand, or may be operated by a control signal, which is, for example, supplied to the contacts 12. It is also conceivable that the switch 44 is set by the control circuit 28. Typically, the switch 44 will be set in the factory when a practical value of the impedance of the antenna 4 to be used is known. The purpose of the transformation selection circuit is that the current of the transmission signal which is supplied via the line 10 to the connection contacts 12 is transformed to a value that is appropriate for the antenna 4. The operation of the system described up to this point is as follows.

With the reader 8 a transmission signal 10 is supplied to the connection contacts 12. This transmission signal is supplied via the transformation selection circuit 36, in transformed form, i.e., with an adjusted magnitude of the current, via the tuning circuit 18 to the antenna 4. The supply circuit 26 is connected via a transformer 46 with the connection contacts 12 for drawing energy from the transmission signal. The electronic circuit is so arranged that the measuring and control circuit 27 (the phase comparator 34, the current circuit 30, the voltage circuit 32, the control circuit 28, a reset circuit 54, to be discussed hereinafter, and the tuning circuit 18) as well as, possibly, the transformation selection circuit 36, receive energy from the supply circuit 26 for their operation. This means that the electronic circuit draws the energy the electronic circuit needs for its operation wholly from the transmission signal which is supplied by the reader 8 to the connection contacts 12. It may then be so that the transformation selection circuit 36 needs no energy from the supply circuit for a proper operation because, for example, the selection switch 44 can be operated by hand and/or because the current circuit 30 can obtain its energy directly from the transmission signal which is supplied to the antenna 4.

The supply circuit 26 is provided in this example with a supply unit 48 which generates a stable direct voltage which is supplied via line 67 to the measuring and control circuit 27 for energy supply to the measuring and control circuit 27. In this example, the supply unit 48 further generates a clock signal which is supplied via line 68 to the control circuit 28. This is not requisite but provides the advantage that the course of the processes of the control circuit 28 can be managed well in terms of timing, because the clock of the control circuit is now coupled to the frequency of the signal transmitted by the reader. Because the electronic circuit draws the energy that it needs for its operation from the transmission signal, it also holds, inherently, that the supply circuit as part of the electronic circuit draws the energy that the supply circuit needs for its operation from the transmission signal which is supplied by the reader 8 to the connection contacts 12.

In use, the phase comparator of the measuring and control circuit 27 measures the phase difference between the first and the second signal, i.e., the phase difference between the phase of the current through the antenna and the phase of the voltage across the series connection of the antenna 4 and the tuning capacity 20. This phase difference is supplied via line 50 to the control circuit 28. The control circuit is arranged, on the basis of this phase difference, to control the tuning circuit in such a manner, i.e., to determine and regulate (set) the magnitude of the capacity 20 in such a manner, that the antenna unit has an impedance which has, at least substantially, no imaginary component in use of the transmission signal concerned. This means in practice that the phase of the voltage across the series connection of the tuning capacity 20 and the antenna 4 and the current through the antenna 4 is equal. The only impedance that the antenna 4 thus forms, together with the tuning circuit, is the resistance R of the antenna 4 (as well as a relatively small resistance of the tuning capacity 20 and the associated switches 24.*i*). As a result, the antenna unit works very efficiently under supply of the transmission signal concerned. So it holds that the measuring and control circuit is arranged to measure whether the antenna in combination with the tuning circuit comprises an impedance with an imaginary component and to control the tuning circuit such that any measured imaginary component is reduced. In particular, it holds that the measuring and control circuit controls the tuning circuit to reduce the measured imaginary component of the impedance when the measured imaginary component is greater than a predetermined value. If the measured imaginary component is smaller than a predetermined value, it can hold, for example, that the impedance of the antenna unit comprises at least substantially no imaginary component at the transmission signal concerned. In that case, the measuring and control circuit will not adjust the magnitude of the tuning capacity. The control circuit 28 may be so arranged, for example, that it delivers a signal to adjust the value of the tuning capacity 20 only when the measured phase difference sent to the control circuit via line 50 exceeds a predetermined value. The measurement and possible (re)adjustment control of the tuning capacity is also designated herein as the tuning of the antenna.

In this example, the electronic circuit is arranged for, as soon as it receives a transmission signal, hence upon connection of the antenna unit to the reader and upon activation of the reader, tuning (through measuring and control as discussed above) the antenna such that the antenna unit has an impedance which has at least substantially no imaginary component in use of the transmission signal concerned right after the tuning mentioned has taken place. Further, in this example, the electronic circuit is so arranged that (through measuring and control as set out above) in the antenna unit at predetermined moments (for example, moments uniformly spaced in time) the tuning of the antenna is measured and where necessary is readjusted (for example, if the output signal of the phase comparator 34 exceeds a predetermined value).

In this example, it holds further that the electronic circuit is controllable with a control signal which is supplied to the connection contacts 12. With the aid of the control signal, for example, the control circuit 28 can be activated for carrying out a tuning by means of the measuring and control mentioned. This control signal then forms an activation signal.

According to a particular variant, as discussed above, it holds that the activation signal is formed by the transmission signal, so that the antenna unit carries out the tuning as soon as the transmission signal is supplied to the antenna unit. It is also possible, as discussed above, that during a period that a transmission signal is supplied to the antenna unit, such a tuning is carried out at predetermined moments, for example, regularly. To that end, the control unit 28 may be provided with a clock which monitors when the tuning of the antenna unit has last been measured and possibly adjusted and determines on the basis thereof when a new measurement and possibly an adjustment is to be carried out.

When a responder that is introduced into the interrogation field emitted with the aid of the antenna 4 responds, the received signal is received with the aid of the antenna 4 and supplied via the tuning circuit 18 and the transformer circuit 36, the connection contacts 12 and the line 10 to the reader 8.

In this example, the electronic circuit is further provided with a terminating switch for terminating the energy supply to the supply circuit 26. In this example, the terminating switch 52 is included in the supply circuit 26 and upon being closed forms a short-circuit. The switch 52 is controlled by the control circuit 28. The switch 52, in use, is momentarily closed and opened again by the control circuit in the rhythm of the data to be sent by the control circuit 28 to the reader. As a result, the energy supply of the reader to the antenna unit varies, as a result of which the reader measures a varying energy consumption and can derive the data therefrom. The data to be sent may be, for example, error codes which are generated by the control circuit. In this example, the terminating switch 52 is operated by the control circuit 28 via a line 66.

The above-mentioned control signals that are supplied to the electronic circuit 6 by the reader may, for example, be superposed on the transmission signal in a manner known per se. The control signal supplied to the tuning circuit 18 by the reader hence reaches the control circuit 28 via the transformation selection circuit and the supply circuit, for example via the line 67 via which also energy is supplied to the control circuit 28.

In the example, the electronic circuit is further provided with a reset unit 54 for resetting the control circuit 28 when the energy supply of the reader to the antenna unit becomes insufficient. This energy supply can diminish, for example, when the antenna unit is not properly tuned anymore. This has as a consequence that the imaginary part of the impedance of the antenna unit increases. In order that a same quantity of energy be transmitted, more energy will then need to be supplied to the antenna unit. The reset unit 54 measures the amount of energy that is supplied to the antenna unit by the reader and when this energy falls below a predetermined value, a reset of the reset unit will have as a consequence that the antenna is tuned again by the electronic circuit as discussed above.

In this example, it further holds that the electronic circuit is arranged for generating an error signal which is supplied to the connection contacts for reception by the reader when the tuning cannot be carried out in a predetermined desired manner. It may happen, for example, that the control circuit 28 sets the magnitude of the tuning capacity 20 such that the expectation is for the imaginary component of the impedance of the antenna 4 to be completely compensated. When thereupon it appears from the phase difference between the first and the second signal that is determined by the phase comparator 34 that the tuning mentioned has not been successful, the control circuit 28 can set the magnitude of the capacity again. If it is right, adjustment will proceed iteratively towards the desired tuning. If it proves to fail, however, the control circuit 28 can generate an error signal, for instance on line 66 for controlling the switch 52 in the rhythm of the error signal to be sent to the reader. The error signal is then, for example, superposed on the transmission signal supplied to the connection contacts. The reader is arranged to receive the error signal and may, for example, proceed to make it known on a display. Also, an alert signal may be generated, such as an audiovisual alert.

In this example, it holds that the electronic circuit is mechanically attached to the antenna. This is apparent from FIG. 1. For example, the electronic circuit is included in a housing 72 which is mechanically attached to the antenna 4. In this example, the electronic circuit is included in a housing which has been provided through injection molding. Here, this housing also encloses a part of the antenna, so that the housing is mechanically connected with the antenna 4. Naturally, the housing can also consist of a hollow housing in which the electronic circuit is included. Such variants are within the framework of the invention. Also, it is conceivable that the electronic circuit is designed in a different manner than described above. For example, the supply circuit and a phase comparator may be integrated. Also, it is conceivable that the phase comparator and the control circuit 28 are integrated, possibly in combination with the tuning circuit. Such variants are each understood to be within the framework of the invention.

The invention claimed is:

1. An antenna unit comprising:
    an antenna comprising at least one turn, and
    an electronic circuit connected with the antenna, wherein the electronic circuit comprises connection contacts for connecting the antenna unit with a transmitting device, wherein the electronic circuit:
        draws operating energy for the electronic circuit from a transmission signal supplied to the connection contacts, and
        utilizes the operating energy to tune the antenna unit such that the antenna unit has an impedance with substantially no imaginary component in the transmission signal,
    wherein the electronic circuit comprises a tuning circuit which forms a tuning capacity which is connected with the antenna, and wherein the tuning circuit is arranged to set a magnitude of the tuning capacity,
    wherein the electronic circuit further comprises:
        a supply circuit for taking up the operating energy from the transmission signal; and
        a measuring and control circuit comprising the tuning circuit, wherein the electronic circuit is arranged such that the measuring and control circuit, in operation, receives energy required therefor from the supply circuit, and wherein the measuring and control circuit is arranged to:
            measure whether the antenna in combination with the tuning circuit comprises an impedance with an imaginary component, and
            control the tuning circuit such that any measured imaginary component is reduced;
    wherein the measuring and control circuit comprises:
        a control circuit,
        a current circuit that generates a first signal representing a phase of a current through the antenna,
        a voltage circuit that generates a second signal representing a phase of a voltage across the antenna and the tuning circuit, and
        a phase comparator that compares the first signal and the second signal,
        wherein the control circuit, on the basis of a phase difference signal generated by the phase comparator that represents a phase difference between the first and second signal, controls the tuning circuit to reduce the imaginary component, and
    wherein the electronic circuit further comprises a transformation selection circuit comprising:
        a settable transformer connected by a first side with the connection contacts and connected by a second side with the tuning circuit, and
        a selection switch, wherein a ratio between first side turns of the settable transformer and second side turns of the settable transformer is adjusted by the selection switch.

2. The antenna unit according to claim 1, wherein the electronic circuit is mechanically attached to the antenna.

3. The antenna unit, according to claim 2, wherein the electronic circuit is included in a housing mechanically attached to the antenna.

4. The antenna unit according to claim 3, wherein the electronic circuit is included in a housing formed through injection molding.

5. The antenna unit according to claim 4, wherein the housing also encloses a part of the antenna.

6. The antenna unit according to claim 1, wherein the electronic circuit is arranged to determine the tuning capacity magnitude and set the tuning capacity magnitude, such that the tuning capacity substantially compensates the imaginary part of the impedance of the antenna in the transmission signal.

7. The antenna unit according to claim 1, wherein the measuring and control circuit selectively controls the tuning circuit to reduce the measured imaginary component of the impedance in response to determining that the measured imaginary component is greater than a predetermined value.

8. The antenna unit according to claim 1, wherein the electronic circuit further comprises a terminating switch for modulating energy supplied to the connection contacts.

9. The antenna unit according to claim 1, wherein the current circuit is part of the supply circuit.

10. The antenna unit according to claim 1, wherein the voltage circuit is part of the transformation selection circuit.

11. The antenna unit according to claim 1, wherein the electronic circuit further comprises a reset unit for resetting the electronic circuit when energy supply to the antenna unit falls below a predetermined value, and
wherein, as a result of resetting, the antenna is re-tuned by the electronic circuit.

12. The antenna unit according to claim 1, wherein the electronic circuit, at the start of supplying a transmission signal to the antenna unit and/or at predetermined moments when a transmission signal is supplied to the antenna unit, tunes the antenna unit such that the antenna unit has an impedance having substantially no imaginary component in use of the transmission signal.

13. The antenna unit according to claim 1, wherein a control signal supplied to the connection contacts controls the electronic circuit.

14. The antenna unit according to claim 8, wherein the terminating switch is controllable, by the control circuit, for sending data to a reader connected with the connection contacts by closing and opening again the terminating switch in a rhythm of a sending rate of the data.

15. The antenna unit according to claim 1, wherein said ratio between the turns is settable with a control signal supplied to the connection contacts.

16. The antenna unit according to claim 1, wherein the electronic circuit generates an error signal supplied to the connection contacts when tuning cannot be carried out in a predetermined desired manner.

17. The antenna unit according to claim 16, wherein the error signal is superposed on the transmission signal supplied to the connection contacts.

18. The antenna unit according to claim 1, wherein the antenna unit suitable for incorporation in a half-duplex system and in a full-duplex system.

19. The antenna unit according to claim 1, wherein the electronic circuit activates, in response to a command, to carry out tuning the antenna unit.

20. The antenna unit according to claim 19, wherein the tuning starts via an activation signal supplied to the electronic circuit, and wherein the activation signal is supplied via one or more of the group consisting of: the connection contacts, and a manually operable switch.

21. The antenna unit according to claim 20, wherein the activation signal is formed by the transmission signal, the antenna unit carrying out the tuning as a result of the transmission signal being supplied to the antenna unit.

22. A system comprising:
an antenna unit comprising:
an antenna comprising at least one turn, and
an electronic circuit connected with the antenna, wherein the electronic circuit comprises connection contacts for connecting the antenna unit with a transmitting device,
wherein the electronic circuit:
draws operating energy for the electronic circuit from a transmission signal supplied to the connection contacts, and
utilizes the operating energy to tune the antenna unit such that the antenna unit has an impedance with substantially no imaginary component in the transmission signal; and
a reader for reading out a responder, wherein the reader is connected with the connection contacts to supply a transmission signal to the antenna unit to emit an electromagnetic interrogation field with the antenna unit, wherein a responder, when introduced into the interrogation field, responds by emitting a reply signal,
wherein the electronic circuit comprises a tuning circuit which forms a tuning capacity which is connected with the antenna, and wherein the tuning circuit is arranged to set a magnitude of the tuning capacity,
wherein the electronic circuit further comprises:
a supply circuit for taking up the operating energy from the transmission signal; and
a measuring and control circuit comprising the tuning circuit, wherein the electronic circuit is arranged such that the measuring and control circuit, in operation, receives energy required therefor from the supply circuit, and wherein the measuring and control circuit is arranged to:
measure whether the antenna in combination with the tuning circuit comprises an impedance with an imaginary component, and
control the tuning circuit such that any measured imaginary component is reduced;
wherein the measuring and control circuit comprises:
a control circuit,
a current circuit that generates a first signal representing a phase of a current through the antenna,
a voltage circuit that generates a second signal representing a phase of a voltage across the antenna and the tuning circuit, and
a phase comparator that compares the first signal and the second signal,
wherein the control circuit, on the basis of a phase difference signal generated by the phase comparator that represents a phase difference between the first and second signal, controls the tuning circuit to reduce the imaginary component, and
wherein the electronic circuit further comprises a transformation selection circuit comprising:
a settable transformer connected by a first side with the connection contacts and connected by a second side with the tuning circuit, and
a selection switch, wherein a ratio between first side turns of the settable transformer and second side turns of the settable transformer is adjusted by the selection switch.

23. The system according to claim 22, wherein the system receives the reply signal from the responder via the antenna unit and supplies the reply signal via the connection contacts to the reader.

24. The system according to claim 22, wherein a control signal supplied to the connection contacts controls the electronic circuit.

25. The system according to claim 24, wherein the reader is arranged to superpose the control signal on the transmission signal.

26. The system according to claim 22, wherein the electronic circuit further comprises a terminating switch for modulating energy supplied to the connection contacts, and wherein the reader is arranged to detect the terminating switch being closed.

27. The system according to claim 22, wherein the electronic circuit generates an error signal supplied to the connection contacts when tuning cannot be carried out in a predetermined desired manner, wherein the reader is arranged to receive the error signal.

\* \* \* \* \*